United States Patent
Eguchi et al.

(10) Patent No.: US 7,371,624 B2
(45) Date of Patent: May 13, 2008

(54) METHOD OF MANUFACTURING THIN FILM SEMICONDUCTOR DEVICE, THIN FILM SEMICONDUCTOR DEVICE, ELECTRO-OPTICAL DEVICE, AND ELECTRONIC APPARATUS

(75) Inventors: Tsukasa Eguchi, Showa-cho (JP); Hiroshi Sera, Chino (JP)

(73) Assignee: Seiko Epson Corporation, Tokyo (JP)

( * ) Notice: Subject to any disclaimer, the term of this patent is extended or adjusted under 35 U.S.C. 154(b) by 358 days.

(21) Appl. No.: 11/175,267

(22) Filed: Jul. 7, 2005

(65) Prior Publication Data

US 2006/0079035 A1   Apr. 13, 2006

(30) Foreign Application Priority Data

Sep. 30, 2004  (JP) .............................. 2004-288677

(51) Int. Cl.
*H01L 21/00*  (2006.01)
*H01L 21/84*  (2006.01)

(52) U.S. Cl. ................... 438/155; 438/163; 438/164
(58) Field of Classification Search ................ None
See application file for complete search history.

(56) References Cited

U.S. PATENT DOCUMENTS

| | | | |
|---|---|---|---|
| 6,542,205 B2 | 4/2003 | Ohtani et al. | |
| 6,583,472 B1 | 6/2003 | Shibata et al. | |
| 6,618,029 B1 | 9/2003 | Ozawa | |
| 6,808,964 B2* | 10/2004 | Hayashi et al. | 438/149 |
| 6,852,577 B2* | 2/2005 | Chen | 438/163 |
| 6,867,077 B2* | 3/2005 | Nakazawa et al. | 438/153 |
| 6,878,584 B2* | 4/2005 | Seo et al. | 438/239 |
| 6,887,742 B2* | 5/2005 | Baek et al. | 438/149 |
| 6,955,953 B2* | 10/2005 | Yamazaki et al. | 438/162 |
| 7,098,086 B2 | 8/2006 | Shibata et al. | |
| 7,122,835 B1 | 10/2006 | Ikeda et al. | |
| 7,179,698 B2* | 2/2007 | Yamazaki et al. | 438/166 |
| 2001/0029070 A1* | 10/2001 | Yamazaki et al. | 438/149 |
| 2002/0048864 A1* | 4/2002 | Yamazaki et al. | 438/151 |
| 2003/0138998 A1* | 7/2003 | Yamazaki et al. | 438/155 |
| 2003/0151568 A1 | 8/2003 | Ozawa | |
| 2003/0193493 A1 | 10/2003 | Ozawa | |

(Continued)

FOREIGN PATENT DOCUMENTS

| | | |
|---|---|---|
| JP | 06-130413 A | 5/1994 |
| JP | A-2000-353811 | 12/2000 |
| JP | A-2002-149087 | 5/2002 |

*Primary Examiner*—David E Graybill
(74) *Attorney, Agent, or Firm*—Oliff & Berridge PLC

(57) ABSTRACT

A method of manufacturing a thin film semiconductor device which includes a thin film transistor having a first semiconductor layer, a gate insulating layer, and a gate electrode which are laminated in this order on a substrate, and a capacitive element having a lower electrode that conductively connects a second semiconductor layer coplanar with the first semiconductor layer, a dielectric layer coplanar with the gate insulating layer, and an upper electrode coplanar with the gate electrode which are laminated in this order on the substrate is provided. The method includes, after simultaneously forming the gate insulating layer and the dielectric layer, and before forming the gate electrode and the upper electrode, introducing dopants into the second semiconductor layer from a first opening of a mask formed on a surface of the substrate to form the lower electrode, and etching a surface of the dielectric layer from the first opening of the mask.

4 Claims, 13 Drawing Sheets

U.S. PATENT DOCUMENTS

| | | | |
|---|---|---|---|
| 2003/0219932 A1* | 11/2003 | Isobe et al. | 438/151 |
| 2004/0002180 A1* | 1/2004 | Kim et al. | 438/73 |
| 2004/0096999 A1* | 5/2004 | Lin et al. | 438/30 |
| 2004/0241918 A1* | 12/2004 | Sera | 438/151 |
| 2004/0248387 A1* | 12/2004 | Kawasaki et al. | 438/479 |
| 2005/0052371 A1 | 3/2005 | Ozawa | |
| 2005/0167674 A1 | 8/2005 | Shibata et al. | |
| 2006/0008955 A1* | 1/2006 | Sera et al. | 438/163 |
| 2006/0076560 A1* | 4/2006 | Eguchi et al. | 257/59 |
| 2006/0079035 A1* | 4/2006 | Eguchi et al. | 438/155 |
| 2007/0026583 A1 | 2/2007 | Ikeda et al. | |
| 2007/0099128 A1* | 5/2007 | Sera et al. | 430/322 |

* cited by examiner

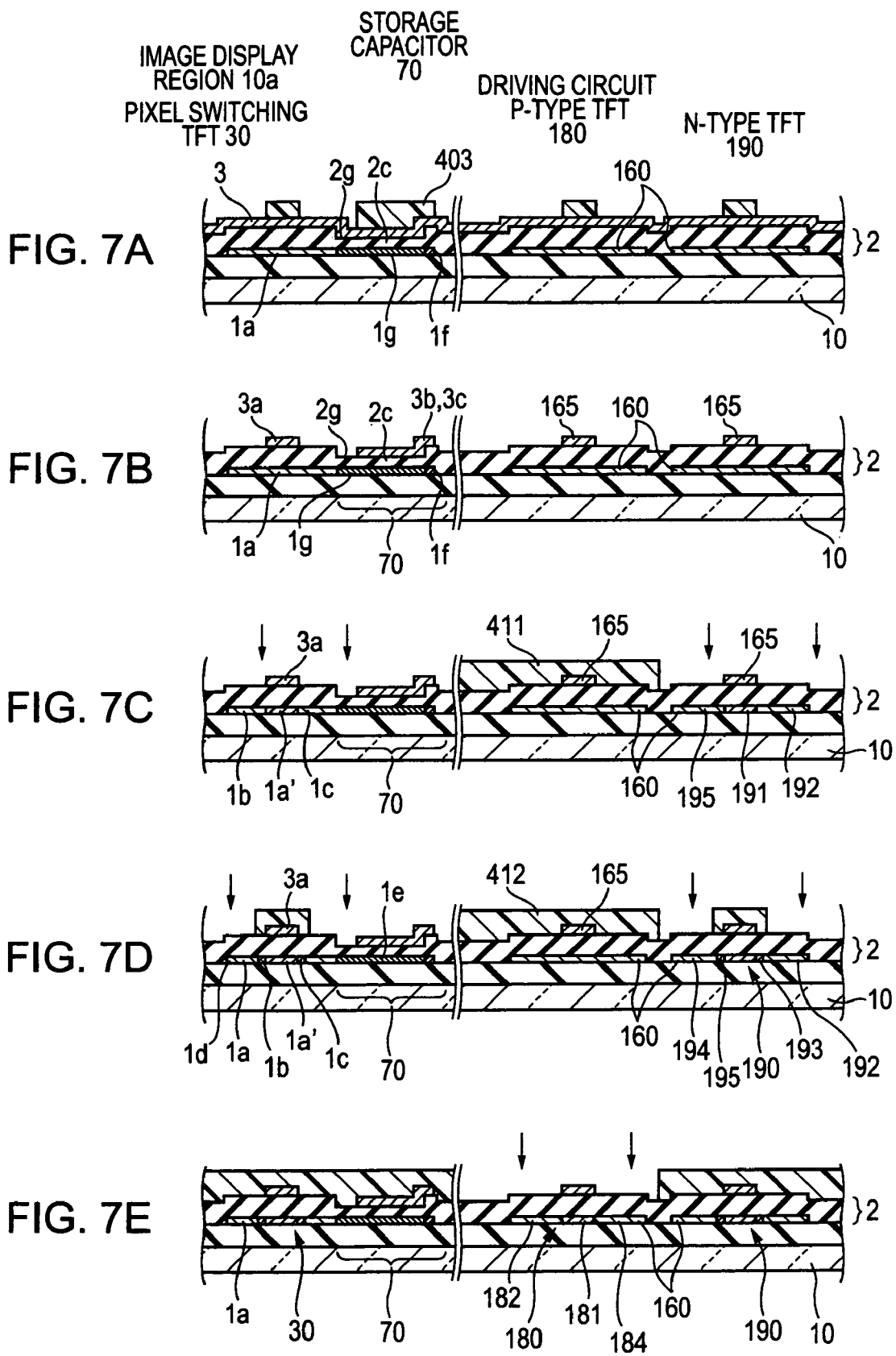

METHOD OF MANUFACTURING THIN FILM SEMICONDUCTOR DEVICE, THIN FILM SEMICONDUCTOR DEVICE, ELECTRO-OPTICAL DEVICE, AND ELECTRONIC APPARATUS

BACKGROUND

The present invention relates to a thin film semiconductor device having thin film transistors (hereinafter, referred to as TFT) and capacitive elements provided on the same substrate, to a method of manufacturing thereof, to an electro-optical device using the thin film semiconductor device as a substrate for the electro-optical device, and to an electronic apparatus having the electro-optical device. More specifically, the present invention relates to a technology of manufacturing a capacitive element having a high capacitance.

In the case of manufacturing a thin film transistor device having TFTs and capacitive elements provided on the same substrate, when a semiconductor layer coplanar with the TFT semiconductor layer is made be conducted to form an electrode, an insulating layer coplanar with a gate insulating layer is used to form a dielectric layer, and a conductive layer coplanar with a gate electrode is used to form an upper electrode, the TFT and the capacitive elements can be provided through the reduced number of processes. This arrangement has been widely used in a device substrate of a liquid crystal device (electro-optical device) that uses TFT as a nonlinear device for switching devices, and various thin film semiconductor devices.

However, for the capacitive element, when the dielectric layer becomes thinner, a larger electrostatic capacitance can be obtained, whereas for the TFT, when the gate insulating layer becomes thinner, the electric strength is reduced. Thus, an arrangement in which the insulating layer formed at the same time with the dielectric layer is thinned to form the dielectric layer, for the capacitive element, is disclosed (for example, refer to Japanese Unexamined Patent Application Publication No. 6-130413)

However, when the thickness of a dielectric layer of the capacitive element and the thickness of the gate insulating layer of the TFT are different from each other, a mask should be added in order to make the dielectric layer of the capacitive element be thinner by etching. For this reason, it is necessary to add each of a mask formation process and a mask removal process. Therefore, there is a problem in that productivity is lowered.

SUMMARY

An advantage of the invention is it provides a method of manufacturing a thin film semiconductor device, a thin film semiconductor device, an electro-optical device using the thin film semiconductor device as a substrate for the electro-optical device, and an electronic apparatus having the electro-optical device, in which a thickness of the dielectric layer of the capacitive element is smaller than a thickness of the gate insulating layer of the TFT without increasing the number of manufacturing processes.

According to an aspect of the present invention, there is provided a method of manufacturing a the thin film semiconductor device including a thin film transistor having a first semiconductor layer, a gate insulating layer, and a gate electrode which are laminated in this order on a substrate, and a capacitive element having a lower electrode that conductively connects a second semiconductor layer coplanar with the first semiconductor layer, a dielectric layer coplanar with the gate insulating layer, and an upper electrode coplanar with the gate electrode which are laminated in this order on the substrate. The method includes after simultaneously forming the gate insulating layer and the dielectric layer, and before forming the gate electrode and the upper electrode, introducing dopants into the second semiconductor layer from a first opening of a mask formed on a surface of the substrate to form the lower electrode, and etching a surface of the dielectric layer from the first opening of the mask.

With the thin film semiconductor device manufactured through the above method, a first concave portion may be formed on the dielectric layer such that a thickness of the dielectric layer is smaller than a thickness of the gate insulating layer. Further, dopants may be introduced on the second semiconductor layer to a region overlapping the first concave portion in plan view to form the lower electrode.

The same layer according to the specification refers to an arrangement in which some or all of the thin film is identically formed between the same layer on the substrate.

In the present invention, for a capacitive element including a lower electrode that conductively connects a second semiconductor layer coplanar with the first semiconductor layer of the TFT side, a dielectric layer coplanar with the gate insulating layer of the TFT side, and an upper electrode coplanar with the gate electrode of the TFT side stacked in turn from the substrate, a method of manufacturing the lower electrode of the capacitive element requires introducing dopants to the second semiconductor layer from the first opening of the mask, after simultaneously forming the gate insulating layer and the dielectric layer and before forming the gate electrode and the upper electrode. According to the present invention, with the above mask, introducing dopants to form the lower electrode and etching the dielectric layer can be performed with one sheet of mask to etch the surface of the dielectric layer from the first opening. Therefore, according to the aspect, a thickness of the dielectric layer of the capacitive element can be smaller than a thickness of the gate insulating layer of the TFT, without increasing the manufacturing process.

In the present invention, for the mask, a second opening may be provided on the thin film transistor to form some or all source and drain regions in the first semiconductor layer of a thin film transistor having the same conductive type as the dopants. In the introducing of dopants to form the lower electrode, the dopants may be introduced to the second semiconductor layer and the first semiconductor layer from the first and second openings. In addition, in the etching of the dielectric layer, a surface of the dielectric layer and a surface of the gate insulating layer may be etched from the first and second openings. With the thin film semiconductor device manufactured according to the above method, in the thin film transistor having the same conductive type as the dopants of the thin film transistor, a second concave portion may be formed on the gate insulating layer such that a thickness of the gate insulating layer overlapping some or all of source and drain regions in plan view is smaller than a thickness of the gate insulating layer of a region overlapping the gate electrode in plan view.

Here, when the source and drain regions have lightly doped source and drain regions self aligned to the gate electrode and highly doped source and drain regions adjacent to the lightly doped source and drain regions, the second opening is formed in a region where the highly doped source and drain regions are to be formed. With the above arrangement, when the highly doped source and drain region can be formed through introducing dopants to form the lower electrode, the number of mask can be reduced by one. For this reason, each a mask formation process and a mask removal process can be reduced by one step, so that productivity is enhanced. With the thin film transistor device manufactured according to the above method, the second concave portion having the lightly doped source and drain regions formed to be self aligned to the gate electrode and the highly doped source and drain regions adjacent to the lightly doped source and drain regions is formed in a region overlapping the highly doped source and drain regions in plan view.

In the present invention, etching the dielectric layer may be performed using an etchant that can etch and remove the dielectric layer and the mask, after the introducing of the dopants to form the lower electrode. With the above arrangement, through etching the dielectric layer, the mask can be removed, so that the mask etching process can be omitted and thus productivity can be further enhanced.

A thin film semiconductor according to the present invention may be used as a substrate for the electro-optical device retaining an electro-optical material for the electro-optical device, for example. Here, the electro-optical material may be a liquid crystal retained between the substrate for the electro-optical device and a counter substrate arranged to face the substrate for the electro-optical device. Further, the thin film transistor and the capacitive element may be included in each of a plurality of pixels arranged in a matrix. In addition, the electro-optical material may be an organic electroluminescent material arranged on the substrate for the electro-optical device; and the thin film transistor and the capacitive element may be included in each of a plurality of pixels arranged in a matrix.

An electro-optical device according to the present invention is used for arranging a display unit and the like for an electronic apparatus such as a portable computer or a mobile telephone.

BRIEF DESCRIPTION OF THE DRAWINGS

The invention will be described with reference to the accompanying drawings, wherein like numbers reference like elements, and wherein:

FIG. 7 is a processing cross-sectional view showing a method of manufacturing TFT array substrate according to the first embodiment of the present invention;

DETAILED DESCRIPTION OF EMBODIMENTS

Figure 1A:
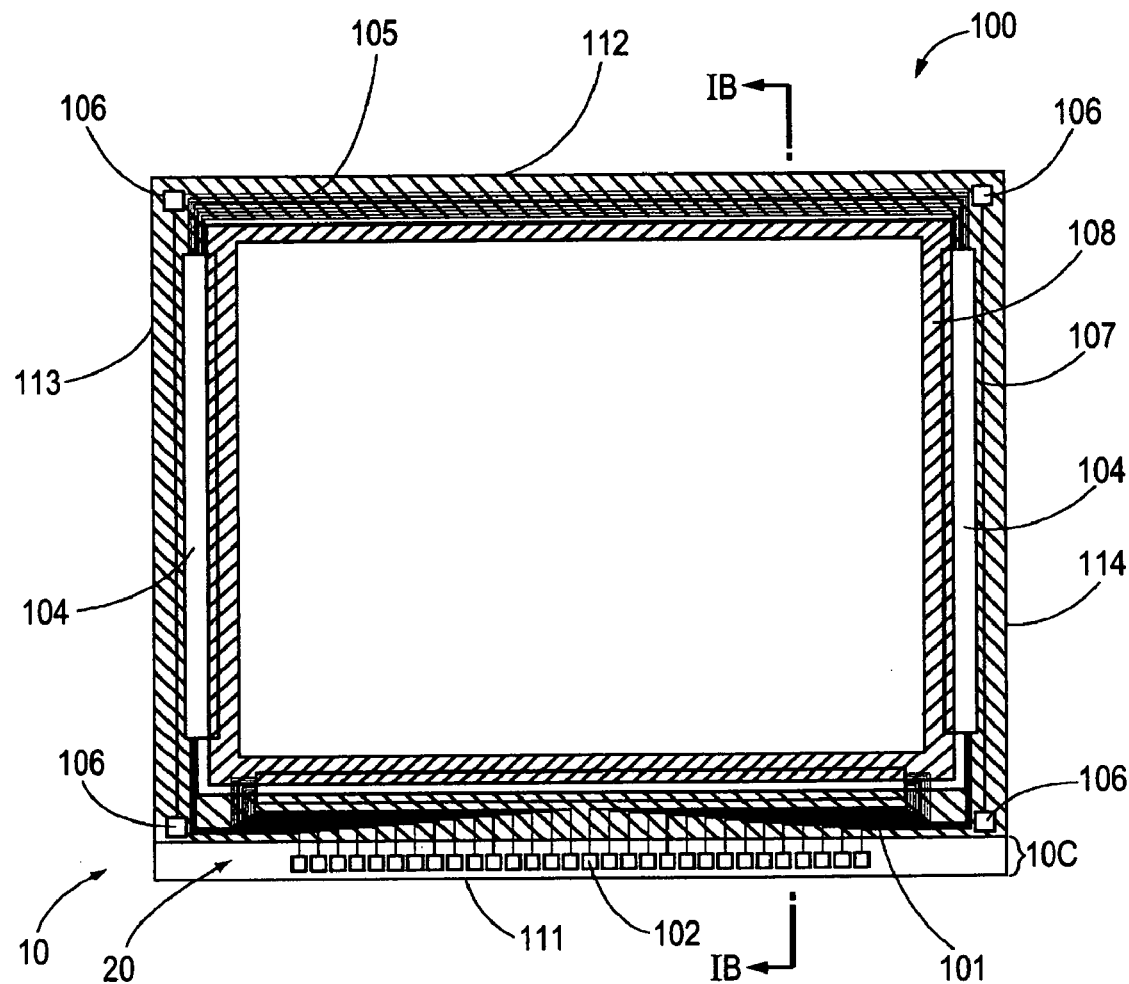
FIGS. 1A and 1B are a plan view seen from a counter substrate side along with each element formed on a liquid crystal device according to a first embodiment of the present invention, and a cross-sectional view of IB-IB of FIG. 1A including the counter substrate, respectively.

An example of a liquid crystal device, which is a typical electro-optical device, adapted to the present invention will be described with reference to the accompanying drawings. In addition, in the drawings, a scale of each layer or member is adjusted in order to have a recognizable size in the drawings.

Figure 1B:
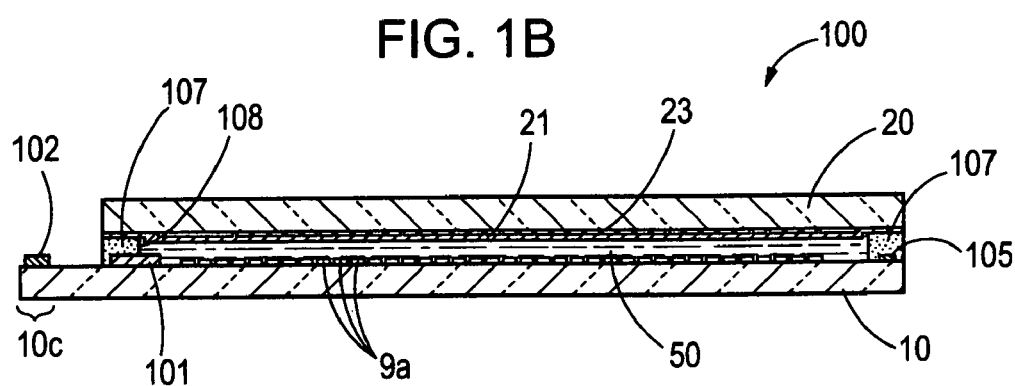

FIGS. 1A and 1B are a plan view seen from a counter substrate side along with each element formed on a liquid crystal device according to a first embodiment of the present invention, and a cross-sectional view of IB-IB of FIG. 1A including the counter substrate, respectively.

Referring to FIGS. 1A and 1B, in a liquid crystal device 100 (electro-optical device), a TFT array substrate 10 (thin film semiconductor device) and a counter substrate 20 are bonded by a sealant 107 (a downward sloping slanted region of FIG. 1A) deposited along an edge of the counter substrate 20. As an electro-optical material, a liquid crystal device 50 is interposed between the TFT array substrate 10 and the counter substrate 20. A data line driving circuit 101 is formed on an outer circumference of the TFT array substrate 10 to overlap a part of the sealant 107 at an edge of the substrate 111, and scanning line driving circuits 104 are formed at two edges 113 and 114 of the substrate. A plurality of terminals 102 are formed in a region 10c extending from the counter substrate 20 of the TFT array substrate 10. A plurality of lines 105 for connecting the scanning line driving circuits 104, which are arranged at both sides of an image display region 10a, to each other are formed at the substrate edge 112 facing the substrate edge 111 of the substrate 10. An inter-substrate conductive material 106 is formed to electrically conduct between the TFT array substrate 10 and the counter substrate 20 at four corners of the counter substrate 20. Here, the inter-substrate conductive material 106 is an epoxy resin based adhesive component compounded with conductive particles such as a silver powder or a gold plated fiber. In addition, the sealant 107 is an adhesive made of a photo curable resin and a thermosetting resin, in which a gap material such as glass fibers or glass beads are compounded to maintain a certain distance between two substrates.

Pixel electrodes 9a are formed in a matrix on the TFT array substrate 10, which will be described in detail. Correspondingly, for the counter substrate 20, a periphery cutting light shielding layer 108 made of a light shielding material is formed on an inner region of the sealant 107 to block peripherals. In addition, on the counter substrate 20, a light shielding layer 23 called as a black matrix or black strips and so on is formed in a region facing horizontal and vertical border regions of the pixel electrodes 9a formed in the TFT array substrate 10, and on the top thereof, a counter electrode 21 made of a ITO layer is formed.

As described below, when the liquid crystal device 100 with the above-mentioned construction is used as a color display device of an electronic apparatus such as a mobile computer, a mobile phone, and a liquid crystal TV, RGB color filters (not shown) are formed in a region facing each pixel electrode 9a of the counter substrate 20.

Figure 2:
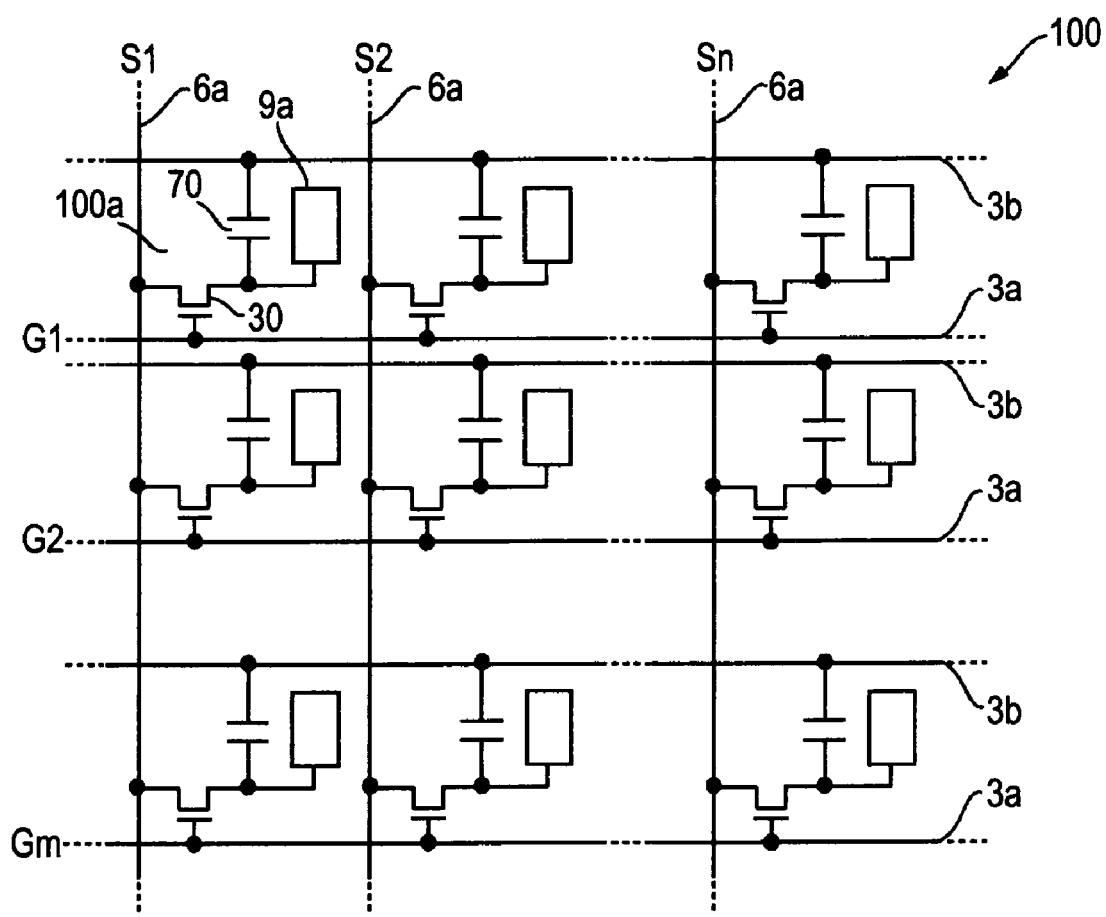
FIG. 2 is a block diagram showing an electrical arrangement of the liquid crystal device.

FIG. 2 is a block diagram showing an electrical arrangement of the liquid crystal device. As shown in FIG. 2, a plurality of pixels 100a are arranged in a matrix corresponding to intersections of a plurality of data lines 6a and a plurality of scanning lines 3a. Each of the plurality of pixels 100a has a pixel electrode 9a and a pixel switching TFT 30 for controlling the pixel electrode 9a, and a data line 6a which supplies a pixel signal is electrically connected to a source of the TFT 30. Pixel signals S1, S2, . . . Sn to be written in the data lines 6a are line-sequentially supplied in this order. In addition, each of scanning lines 3a is electrically connected to a gate of each of the TFTs 30 such that scanning signals G1, G2, . . . Gm are line-sequentially applied to the scanning line 3a in this order in a pulsing manner at a predetermined timing. The pixel electrode 9a is electrically connected to a source of the TFT 30, and thus a switching device, i.e., the TFT 30 turns on only for a certain period to write pixel signals S1, S2, . . . Sn supplied from the data line 6a into each pixel at predetermined timings. As such, the pixel signals S1, S2, . . . Sn of predetermined levels written to the liquid crystal by the pixel electrode 9a are held between the counter electrode 20 and the counter electrode 21 shown in FIG. 1B, for a certain period.

Here, in order to prevent leakage of the held pixel signal, on the TFT array substrate 10, a storage capacitor 70 (capacitive element) is added parallel to the liquid crystal capacitor formed between the pixel electrode 9a and the counter electrode 21. With the storage capacitor 70, a voltage of the pixel electrode 9a is held for a time hundred times longer than the time when the source voltage is applied. In this regard, a charge holding characteristic is improved, and thus the liquid crystal device 100 capable of realizing display with a high contrast ratio can be implemented. Furthermore, while the storage capacitor 70 is formed between the storage lines 3b in the present invention, it may be formed between the scanning line 3a of the preceding paragraph.

Figure 3:
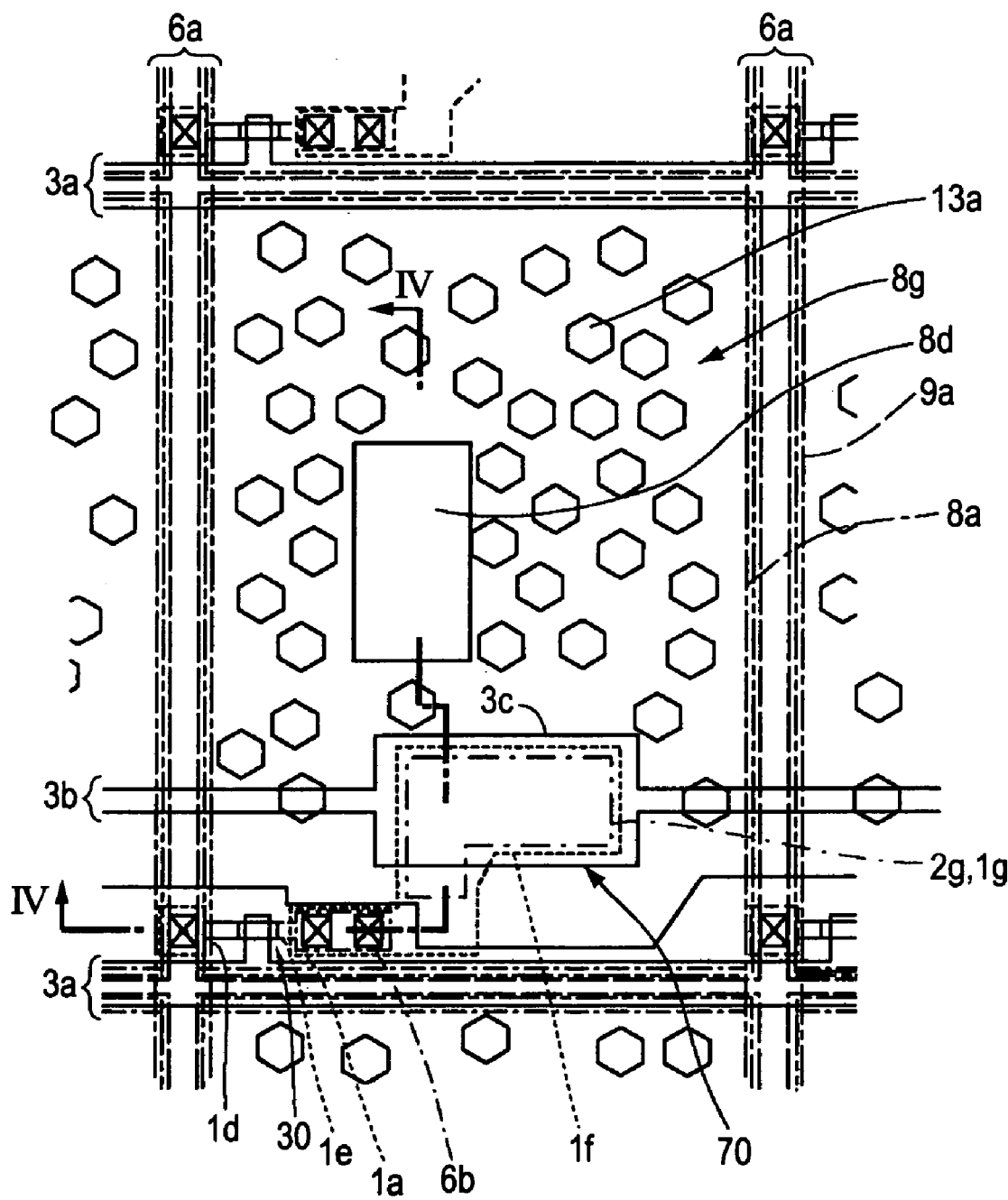
FIG. 3 is a plan view of a circuit adjacent to a TFT array substrate of the liquid crystal device shown in FIG. 1.
Figure 4:
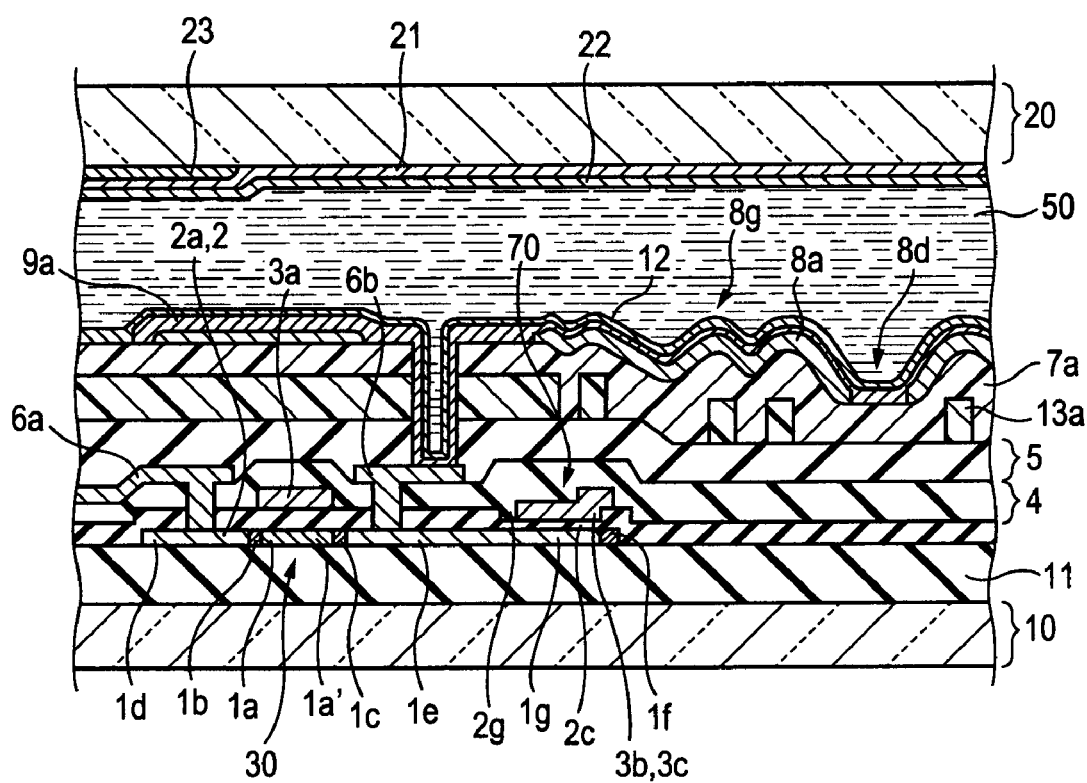
FIG. 4 is a cross-sectional view at a position corresponding to a line of IV-IV of FIG. 3.

FIG. 3 is a plan view of adjacent pixels on a TFT array substrate. FIG. 4 is a cross-sectional view taken along the line IV-IV of FIG. 3.

Referring to FIG. 3, pixel electrodes made of a plurality of transparent indium tin oxide (ITO) layers are formed in a matrix on the TFT array substrate 10, and pixel switching TFTs 30 are respectively connected to these pixel electrodes 9a. In addition, the data line 6a, the scanning line 3a, and the capacitor line 3b are arranged along the horizontal and vertical border region of the pixel electrode 9a, and the TFT 30 is connected to the data line 5a and the scanning line 3a. In other words, the data line 6a is electrically connected to a highly doped source region 1d of the TFT 30 through a contact hole, and the scanning line 3a has a protrusion that constitutes the gate electrode of the TFT 30. The storage capacitor 70 has a lower electrode 1g that causes an extending portion 1f of the semiconductor layer 1a to be conductive, and an upper electrode 3c in a rectangular portion of the capacitor line 3b overlapping the lower electrode 1g, to thus form the pixel switching TFT 30.

As shown in FIG. 4, a transparent substrate 10b is used as a base substance of the TFT array substrate 10, and a base protective layer 11 made of a silicon oxide layer (insulating layer) having a thickness in a range of 300 to 500 nm is formed on a surface of the transparent substrate 10b, and an island shaped semiconductor layer 1a having a thickness in a range of 30 to 100 nm is formed on a surface of the base protective layer 11. The gate insulating layer 2a made of a insulating layer 2 such as a silicon oxide layer having a thickness in a range of 50 to 150 nm is formed on the surface of the semiconductor layer 1a, and the scanning line 3a having a thickness in a range of 300 to 800 nm is formed on the surface of the gate insulating layer 2a. A region of the semiconductor layer 1a that opposes the scanning line 3a through the gate insulating layer 2a becomes a channel region 1a' (active layer). A source region having a lightly doped source region 1b and a highly doped source region 1d is formed on one side of the channel region 1a', and a drain region having a lightly doped drain region 1c and a highly doped drain region 1e is formed on the other side of the channel region 1a'.

An interlayer insulating layer 4 made of a silicon oxide layer having a thickness in a range of 300 to 800 nm is formed on a surface of the pixel switching TFT 30, and an interlayer insulating layer 5 made of a silicon nitride layer having a thickness in a range of 100 to 300 nm is formed on a surface of the interlayer insulating layer 4. The data line 6a having a thickness in a range of 300 to 800 nm is formed on the surface of the interlayer insulating layer 4, and is electrically connected to the highly doped source region 1d through the contact hole formed in the interlayer insulating layer 4. The drain electrode 6b simultaneously formed with the data line 6a is formed on the surface of the interlayer insulating layer, and the drain electrode 6b is electrically connected to the highly doped drain region 1e through the contact hole formed in the interlayer insulating layer 4.

A concave and convex formation layer 13a made of a transparent photosensitive resin is formed in a predetermined pattern on an upper layer of the interlayer insulating layer 5. An upper dielectric layer 7a made of a transparent photosensitive resin is formed on a surface of the concave and convex formation layer 13a, and a light reflection layer 8a serving to display images in a reflection mode is formed with an Al layer on the surface of the upper dielectric layer 7a. The concave and convex portions of the concave and convex formation layer 13a are reflected on the surface of the light reflection layer 8a, to thus form a concave and convex pattern 8g, and the concave and convex pattern 8g is formed in a smooth shape without edges. The pixel electrode 9a is formed on an upper layer of the light reflection layer 8a. The pixel electrode 9a may be directly deposited on a surface of the light reflection layer 8a. Further, the pixel electrode 9a is electrically connected to the drain electrode 6b through the contact hole formed in the upper dielectric layer 7a, the concave and convex layer 13a, and the interlayer insulating layer 5. An alignment layer 12 made of a polyimide layer is formed on a surface of the pixel electrode 9a. The alignment layer 12 is a layer which a rubbing process is performed on the polyimide layer. Further, while a planar shape of the concave and convex formation layer is hexagonal in FIG. 3, the shape may employ various shapes such as a circle and an octagon.

A rectangular light transmission window 8d serving to display images in a transmission mode is formed in the light reflection layer 8a at a part of region overlapping the pixel electrode 9a in plan view, and the pixel electrode 9a made of ITO exists in the portion corresponding to the light transmission window 8d, while the light reflection layer 8a does not exist.

The storage capacitor 70 is arranged such that the rectangular portion of the capacitor line 3*b* faces the extending portion 1*f* that extends from the highly doped drain region 1*e* as an upper electrode 3*c*, through the insulating layer (dielectric layer 2*b*) formed at the same time with the gate insulating layer 2*a*.

In addition, while the TFT 30 is preferably in a LDD arrangement described above, it may be in an offset arrangement where regions corresponding to the lightly doped source region 1*b* and the lightly doped drain region 1*c* are not ion implanted. Further, the TFT 30 may be a self aligned TFT in which highly doped source and drain regions are formed in a self aligned manner by implanting ions at a high concentration using the gate electrode (a part of the scanning lines 3*a*) as a mask.

In addition, while a single gate arrangement having only one gate electrode (the scanning line 3*a*) of the TFT 30 arranged between the source and drain regions is provided in the present embodiment, more than two gate electrodes may be arranged between these regions. Here, the same signal is applied to each gate electrode. As such, when the TFT 30 is arranged in a dual gate (double gate), or a triple gate and so on, a leak current can be prevented at a junction portion between the channel and the source and drain regions, so that an off current can be reduced. When at least one of the gate electrodes is in the LDD arrangement or the offset arrangement, the off current can be further reduced, and thus a stable switching device can be obtained.

As shown in FIGS. 3 and 4, according to the present embodiment, a concave portion 2*g* (a first concave portion) is formed in the dielectric layer 2*c* of the storage capacitor 70 such that a thickness of the dielectric layer 2*c* is smaller than a thickness of the gate insulating layer 2*a*, and dopants are introduced to a region overlapping the concave portion 2*g* in plan view to form an lower electrode 1*g*.

With the TFT array substrate 10 arranged described above, since elements for both the TFT 30 and the storage capacitor 70 are in the same layer, the TFT 30 and the storage capacitor 70 can be formed through a fewer number of processes, as in the method described below. Here, the dielectric layer 2*c* of the storage capacitor 70 is coplanar with the gate insulating layer 2*a* of the TFT 30, but the dielectric layer 2*c* becomes thinner since the concave portion 2*g* is formed, so that an electrostatic capacitance of the storage capacitor 70 can be improved without degrading an electric strength of the TFT 30.

The light shielding layer 23 called as a black matrix or a black stripe is formed on the counter substrate 20 in a region facing row and column border regions of the pixel electrodes 9*a* formed in the TFT array substrate 10, and on top of it, the counter electrode 21 made of an ITO layer is formed. In addition, an alignment layer 22 made of a polyimide layer is formed on an upper layer of the counter electrode 21, in which the alignment layer 22 is a rubbing processing layer to the polyimide layer.

Referring back to FIG. 1A, for the liquid crystal device 100 of the present embodiment, out of the surface side of the TFT array substrate, a peripheral region of an image display region 10*a* is used to form peripheral circuits such as a data line driving circuit 101 and a scanning line driving circuit 104. Basically, the data line driving circuit 101 and the scanning line driving circuit 104 include an N channel TFT and a P channel TFT, as shown in FIG. 5.

Figure 5:
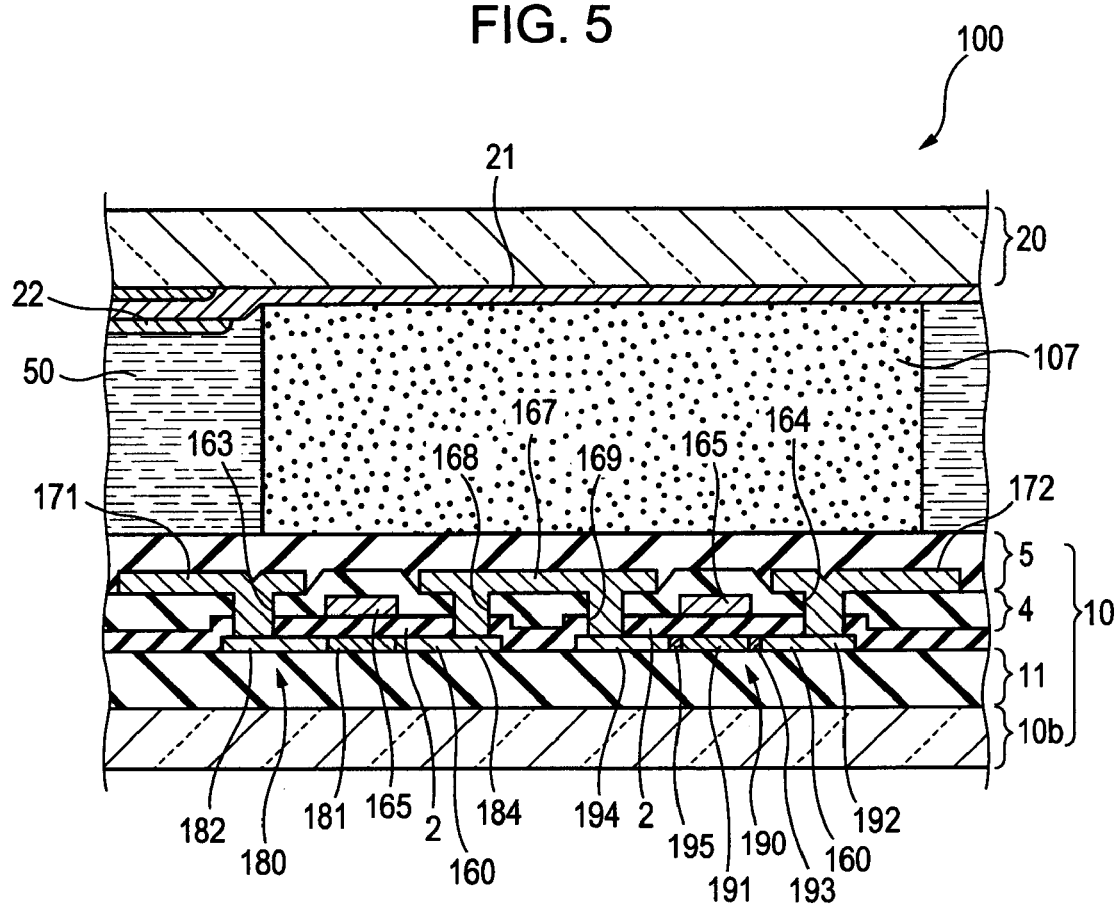
FIG. 5 is a cross-sectional view showing an arrangement of the TFT that constitutes a peripheral circuit for the liquid crystal device shown in FIG. 1.

FIG. 5 is a cross-sectional view showing a TFT arrangement in which peripheral circuits such as the scanning line driving circuit 104 and the data line driving circuit 101 are arranged. Referring to FIG. 5, the TFTs constituting the peripheral circuits include complementary TFTs such as a P channel type TFT 180 or an N channel type TFT 190. A semiconductor layer 160 constituting the driving circuit TFTs 180 and 190 is formed in an island shape on a surface of the base protective layer 11 of the transparent substrate 10*b*. For the TFTs 180 and 190, a high potential line 171 and a low potential line 172 are electrically connected to the source region of the semiconductor layer 160 through the contact holes 163 and 164, respectively. In addition, input wirings 166 are connected to a common gate electrode 165, respectively, and output wirings 167 are electrically connected to a drain region of the semiconductor layer 160 through the contact holes 168 and 169, respectively.

Since the peripheral circuit region is formed through a process as in the image display region 10*a*, the interlayer insulating layers 4 and 5, and the insulating layer 2 (gate insulating layer) are also formed in the peripheral circuit region. In addition, the driving circuit N channel type TFT 190 is also in the LDD arrangement in the same manner as the pixel switching TFT 30, and a source region including a highly doped source region 192 and a lightly doped source region 193 and a drain region including a highly doped drain region 194 and a lightly doped drain region 195 are arranged at both sides of the channel formation region 191. While the driving circuit P type may be the LDD arrangement as in the N channel type TFT 190, according to the present embodiment, the highly doped source region 182 and the highly doped drain region 184 are arranged at both sides of the channel formation region 181 in the self aligned arrangement.

FIGS. 6 and 7 are processing cross-sectional views showing a method of manufacturing the TFT array substrate 10 according to the present embodiment. Further, cross-sectional views of FIGS. 6 and 7 correspond to those in FIGS. 4 and 5.

Figure 6A:
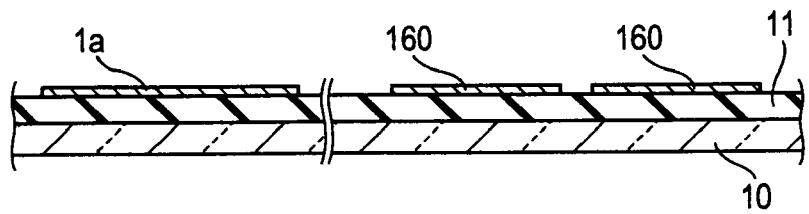
FIG. 6 is a processing cross-sectional view showing a method of manufacturing a TFT array substrate according to the first embodiment of the present invention.

First, as shown in FIG. 6A, the transparent substrate 10*b* made of glass, for example, cleaned by an ultrasonic cleansing is prepared, and then, the based protective layer 11 is formed on that surface and the island shaped semiconductor layer 1*a*, 160 is formed. In order to form such a semiconductor layer 1*a*, 160, a semiconductor layer made of an amorphous silicon layer is formed in a thickness in a range of 30 to 100 nm through a plasma CVD method under the substrate temperature of 150° C. to 450° C., for example, and then a laser light is radiated to laser anneal the semiconductor layer and the semiconductor layer is patterned using a photolithography technology.

Figure 6B:
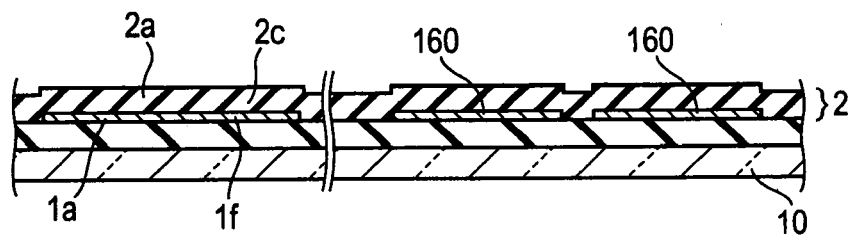

Next, as shown in FIG. 6B, the insulating layer 2 (gate insulating layer 2*a* and dielectric layer 2*c*) such as a silicon oxide layer having a thickness in a range of 50 to 150 nm is formed all over the transparent substrate 10*b* under the temperature condition of not over 350° C. A source gas herein may use a mixed gas of TEOS and oxygen, for example. The insulating layer 2 formed herein may be a silicon nitride layer instead of the silicon oxide layer.

Figure 6C:
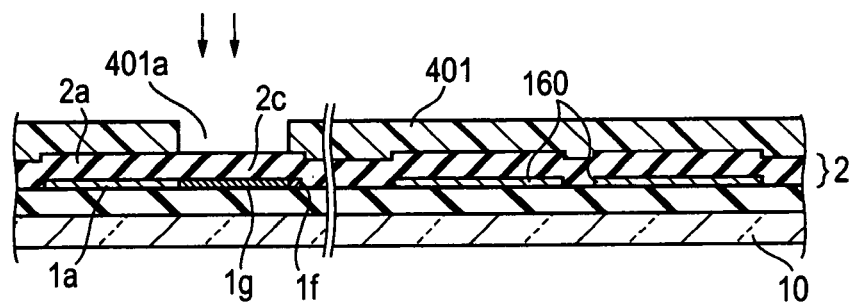

Next, as shown in FIG. 6C, after forming a resist mask 401 on the surface of the insulating layer 2, highly doped N type dopants (P ions) are implanted in a dosage of about $0.1 \times 10^{15}/cm^2$ to $10 \times 10^{15}/cm^2$ into the extending portion 1*f* of the semiconductor layer 1 *a* through the opening 401 *a* (the first opening) of the resist mask 401, to thus form the lower electrode 1*g* that constitutes the storage capacitor 70 (lower electrode forming dopant introduction process).

Figure 6D:
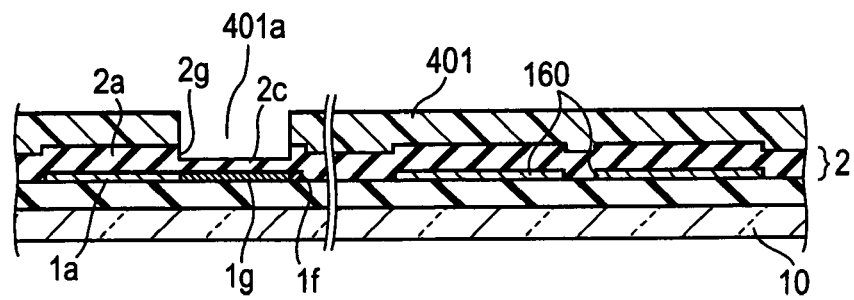

Next, as shown in FIG. 6D, the surface of the dielectric layer 2*c* is etched through the opening 401*a* of the resist mask 401 to form the concave portion 2*g* on the dielectric layer 2*c* (dielectric layer etching process). Subsequently, the resist mask 401 is removed. In addition, the lower electrode forming dopant introduction process and the dielectric layer etching process shown in FIG. 6C can be interchanged.

Next, as shown in FIG. 7E, a conductive layer 3 made of an Al layer, a Ta layer, a Mo layer, or an alloy layer having a primary component contained in any of the above layers is formed all over the transparent substrate 10b in a thickness in a range of 300 to 800 nm through a sputtering method and so on, and then, the resist mask 403 is formed through the photolithography and the conductive layer 3 is dry etched through the resist mask 403. Consequently, as shown in FIG. 7F, the scanning line 3a, the gate electrode 165 and the capacitor line 3b (upper electrode 3c of the storage capacitor 70) are formed. After that, the resist mask 403 is removed.

Next, as shown in FIG. 7G, under a state where the semiconductor layer 160 for forming the P channel type TFT 180 is covered with the resist mask 411, lightly doped N type dopants (P ions) are implanted in a dosage of about $0.1 \times 10^{13}/cm^2$ to $10 \times 10^{13}/cm^2$ into the semiconductor layer 1a that constitutes the pixel switching TFT 30 and the semiconductor layer 160 that constitutes the driving circuit N channel type TFT 190, using the scanning line 3a and the gate electrode 165 as a mask, and then, the lightly doped source region 1b, 193 and the lightly doped drain region 1c, 195 are formed in a self aligned manner to the scanning line 3a and the gate electrode 165. Here, a portion where the dopant ions are not introduced since it is located directly below the scanning line 3a and the gate electrode 165 becomes a channel region 1a', 191 of the semiconductor layer 1a, 160. Subsequently, the resist mask 411 is removed.

Next, as shown in FIG. 7H, the resist mask 412 is formed wider than the scanning line 3a and the gate electrode 66 and covers the semiconductor layer 160 to form the P channel type TFT 180, and under this state, the highly doped N type dopants (P ions) are implanted in a dosage of about $0.1 \times 10^{15}/cm^2$ to $10 \times 10^{15}/cm^2$ to thus form the highly doped source region 1d, 192 and drain region 1e, 194. Subsequently, the resist mask 412 is removed.

Next, as shown in FIG. 7I, under a state where the semiconductor layer 1a, 160 for forming the N channel type TFT 30, 190 is covered with the resist mask 413, highly doped P type dopants (boron ions) are implanted in a dosage of $0.1 \times 10^{15}/cm^2$ to $10 \times 10^{15}/cm^2$ into the semiconductor layer 150 that constitutes the P channel type driving circuit TFT 180 of the driving circuit using the gate electrode 165 as a mask, to thus form the highly doped source region 182 and drain region 184. Subsequently, the resist mask 413 is removed.

Next, as shown in FIGS. 4 and 5, the interlayer insulating layer 4 made of a silicon oxide layer is formed all over the surface of the transparent substrate 10b, and then, the contact holes 163, 164, 168, and 169 are respectively formed in the interlayer insulating layer 4. Subsequently, through a plurality of processes, such as forming the data line 6a and the drain electrode 6b such as an Al layer, a Ta layer, and a Mo layer, the TFT array substrate 10 in the arrangement shown in FIGS. 4 and 5 is employed, but a well known processing in the process can also be used, thus, the explanation thereof will be omitted.

As described above, according to the present embodiment, the storage capacitor 70 includes the extending portion 1f (second semiconductor layer) from the semiconductor layer (first semiconductor layer) of the TFT 30 side, the dielectric layer 2c coplanar with the gate insulating layer 2a of the TFT 30 side, and the upper electrode coplanar with the gate electrode 3a of the TFT 30 side, so that when the lower electrode 1g of the storage capacitor 70 is manufactured, it is necessary to introduce dopants into the extending portion 1f of the semiconductor layer 1a from the opening 401a of the resist mask 401, after forming the gate insulating layer 2a and the dielectric layer 2c at the same time and before forming the gate electrode 3a and the upper electrode 3c. According to the present embodiment, with the resist mask 401, a surface of the dielectric layer 2c is etched from the opening 401a to cause the dielectric layer 2c to be thinner, so that the lower electrode forming dopant introduction process and the dielectric layer etching process can be performed with one mask. Therefore, according to the present embodiment, the thickness of the dielectric layer 2c of the storage capacitor 70 can be smaller than the thickness of the gate insulating layer 2a of the TFT 30 without increasing the number of manufacturing processes.

Figure 8:
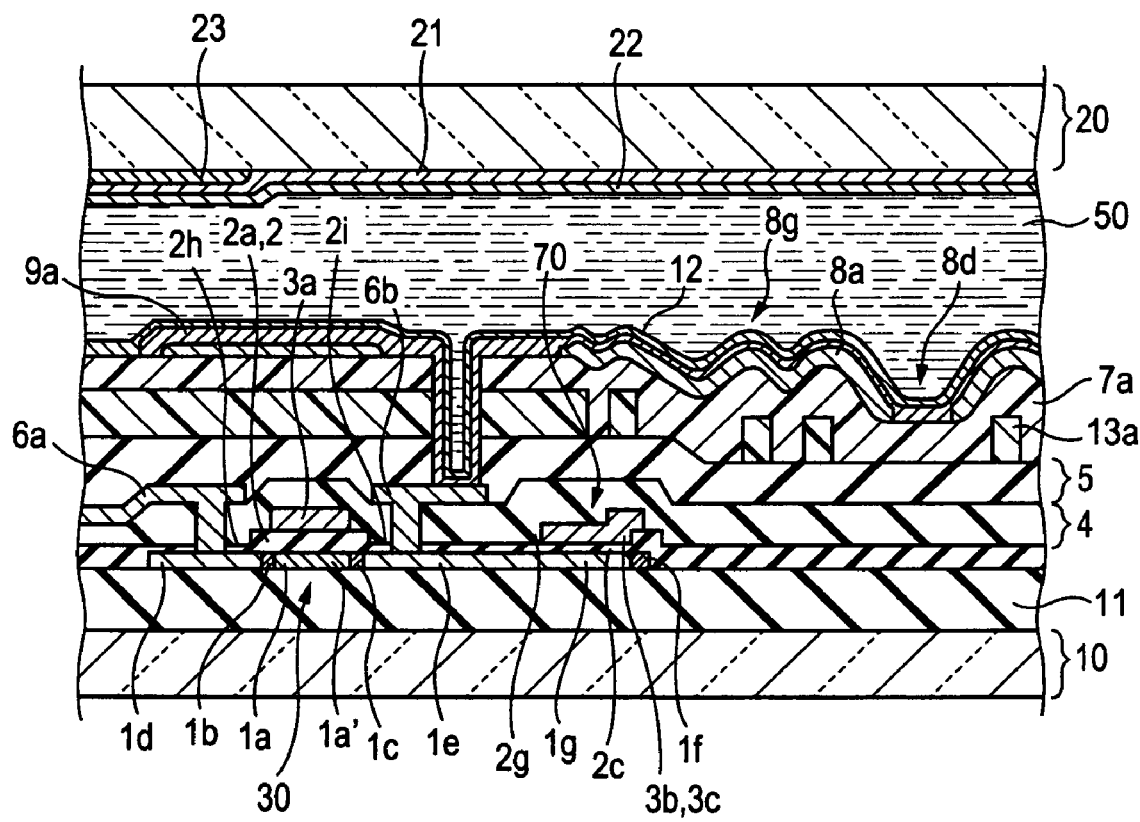
FIG. 8 is a cross-sectional view cutting a TFT array substrate of the liquid crystal device according to a second embodiment of the present invention, at a position corresponding to a line of IV-IV of FIG. 3.
Figure 9:
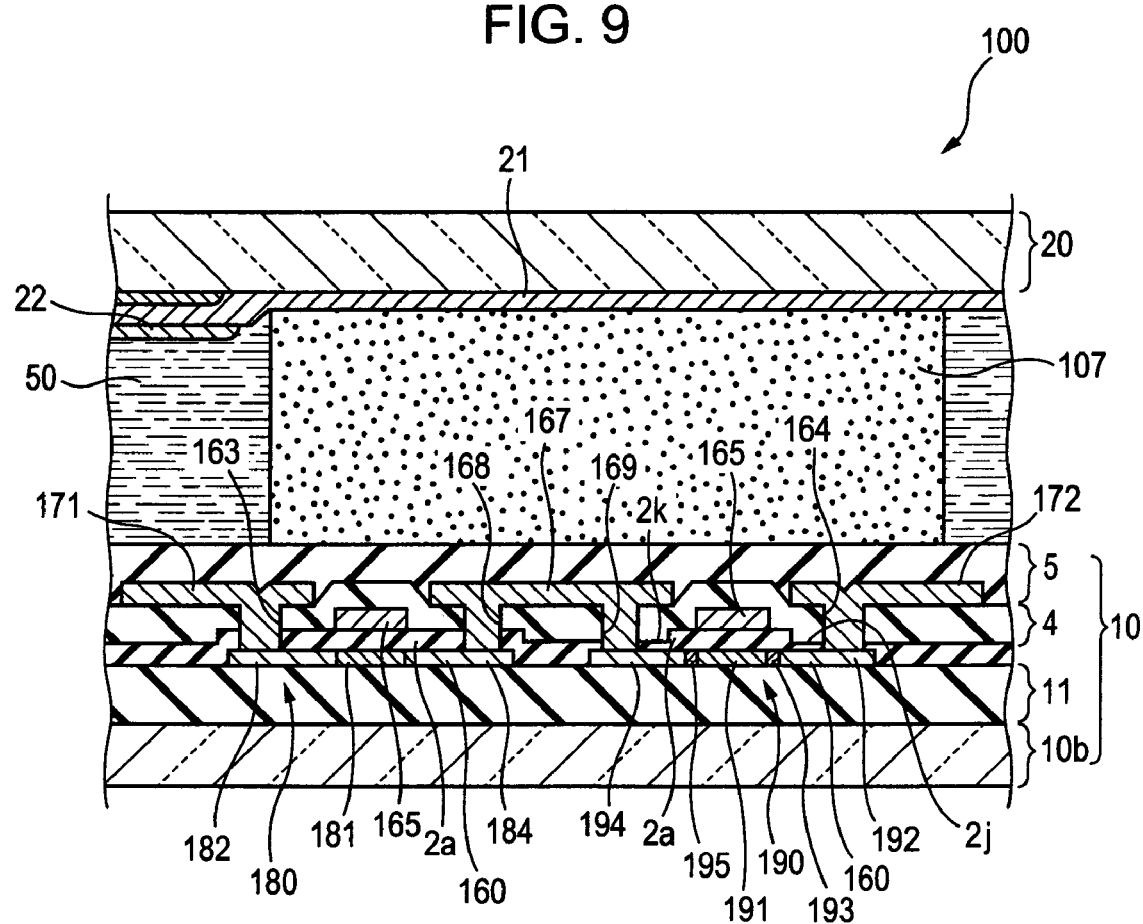
FIG. 9 is a cross-sectional view showing an arrangement of a TFT that constitutes a peripheral circuit for the liquid crystal device shown in FIG. 8.

FIG. 8 is a cross-sectional view cutting a TFT array substrate of the liquid crystal device according to a second embodiment of the present invention, taken along the line IV-IV of FIG. 3. FIG. 9 is a cross-sectional view showing an arrangement of a TFT that constitutes peripheral circuits such as the scanning line driving circuit and the data line driving circuit, for the TFT array substrate of the electro-optical device according to the second embodiment of the present invention. In addition, the electro-optical device according to the second embodiment of the present invention has the same basic arrangement as that of the first embodiment, so that like numbers are given to like elements and the description thereof will be omitted.

As shown in FIG. 8, in the second embodiment as well, for the storage capacitor 70, the concave portion 2g (first concave portion) is formed in the dielectric layer 2c such that the thickness of the dielectric layer 2c is smaller than the thickness of the gate insulating layer 2a, and thus the dopants are introduced into the extending portion 1f of the semiconductor layer at a portion overlapping the concave portion 2g in plan view to form the lower electrode 1g. Here, the concave portion 2g extends to the highly doped drain region 1e of the TFT 30, and thus the highly doped drain region 1e of the TFT 30 is totally joined with the lower electrode 1g.

With the TFT array substrate 10 arranged described above, since elements for both the TFT 30 and the storage capacitor 70 are in the same layer, the TFT 30 and the storage capacitor 70 can be formed through the fewer number of processes, as in the method described below. In addition, the dielectric layer 2c of the storage capacitor 70 is coplanar with the gate insulating layer 2a of the TFT 30, but the dielectric layer 2c becomes thinner since the concave portion 2g is formed, so that an electrostatic capacitance of the storage capacitor 70 can be improved without lowering an electric strength of the TFT 30.

Here, for the N type TFT 30 having the same conduction type as dopants introduced into the lower electrode 1g, concave portions 2h and 2i (second concave portion) are formed in the gate insulating layer 2a such that the thickness of the gate insulating layer 2a of a region overlapping a part or all of the source and drain regions in plan view is smaller than the thickness of the gate insulating layer 2a of a region overlapping the gate electrode 3a in plan view. According to the second embodiment of the present invention, the concave portions 2h and 2i are formed in a region overlapping the highly doped source region 1d and the highly doped drain region 1e in plan view, of the source and drain regions. Therefore, the gate insulating layer 2a overlapping the gate electrode 3a in plan view is thick, and the gate insulating layer 2a of a region overlapping the lightly doped source region 1b and the lightly doped drain region 1c in plan view is also thick.

In addition, as shown in FIG. 9, in the peripheral circuit such as the driving circuit as well, for the N channel type TFT 190 having the same conduction type as the dopants and introduced into the lower electrode 1g, the concave portions 2k and 2j (second concave portion) is formed in the gate insulating layer 2a such that the thickness of the gate insulating layer 2a of the region overlapping a part or all of the source and drain regions in plan view is smaller than the thickness of the gate insulating layer 2a of a region overlapping the gate electrode 165 in plan view. According to the second embodiment of the present invention, the concave portions 2k and 2j are formed in a region overlapping the highly doped source region 192 and the highly doped drain region 194 in plan view, of the source and drain regions. Therefore, the gate insulating layer 2a overlapping the gate electrode 165 in plan view is thick, and the gate insulating layer 2a of a region overlapping the highly doped source region 193 and the lightly doped drain region 195 in plan view is thick.

FIGS. 10 and 11 are processing cross-sectional views showing a method of manufacturing the TFT array substrate 10 according to the second embodiment. In addition, cross-sectional views of FIGS. 10 and 11 correspond to those in FIGS. 8 and 9.

Figure 10A:
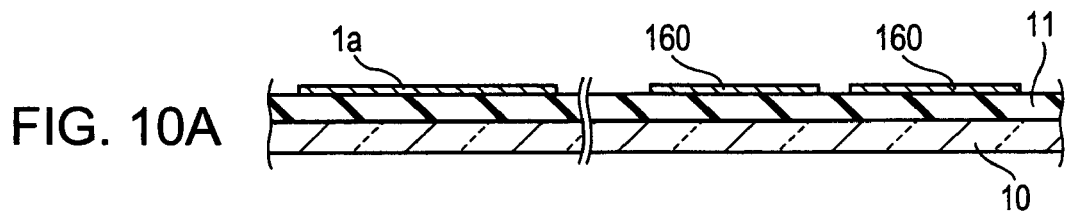
FIG. 10 is a processing cross-sectional view showing a TFT array substrate manufacturing method according to the second embodiment of the present invention.

First, as shown in FIG. 10A, the transparent substrate 10b made of glass, for example, cleaned by an ultrasonic cleansing is prepared, and then, the based protective layer 11 is formed on that surface and the island shaped semiconductor layer 1a, 160 is formed. In order to form such semiconductor layer 1a, 160, a semiconductor layer made of an amorphous silicon layer is formed in a thickness in a range of 30 to 100 nm through a plasma CVD method under the substrate temperature of 150° C. to 450° C., for example, and then a laser light is illuminated to laser anneal the semiconductor layer and the semiconductor layer is patterned using a photolithography technology.

Figure 10B:
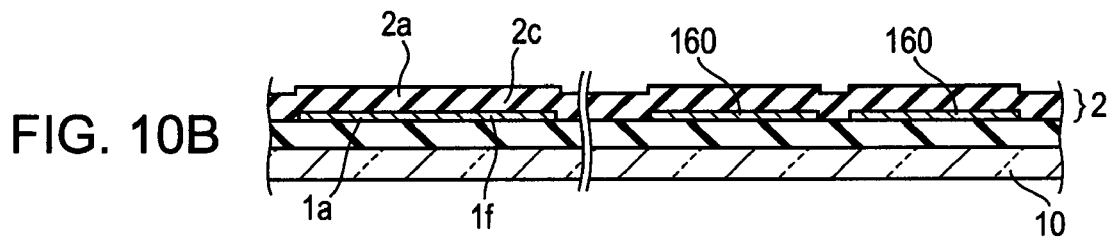

Next, as shown in FIG. 10B, the insulating layer 2 (gate insulating layer 2a and dielectric layer 2c) such as a silicon oxide layer having a thickness in a range of 50 to 150 run is formed all over the transparent substrate 10b under the temperature condition of not over 350° C. A source gas herein may use a mixed gas of TEOS and oxygen, for example. The insulating layer 2 formed herein may be a silicon nitride layer instead of the silicon oxide layer.

Figure 10C:
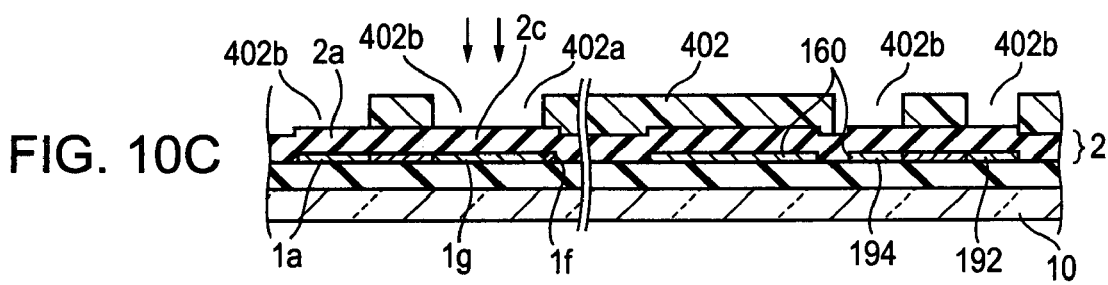

Next, as shown in FIG. 10C, after forming a resist mask 402 on the surface of the insulating layer 2, highly doped N type dopants (P ions) are implanted in a dosage of about $0.1 \times 10^{15}/cm^2$ to $10 \times 10^{15}/cm^2$ into the extending portion If of the semiconductor layer 1a through the opening 401 a (the first opening) of the resist mask 402, to thus form the lower electrode 1g that constitutes the storage capacitor 70 (lower electrode forming dopant introduction process).

In addition, for the resist mask 402 using the lower electrode forming dopant introduction process, the opening 402b (second opening) for forming some or all of the source and drain regions is formed in the semiconductor layer 1a, 190 of the TFT 30. According to the second embodiment of the present invention, the opening 402b is formed in a region where the highly doped source region 1d and the lightly doped drain region 1e are to be formed. In addition, the opening 402 is also formed in a region where the highly doped source region 192 and the highly doped drain region 194 are to be formed. Therefore, in the lower electrode forming dopant introduction process, the highly doped N type dopants (P ions) are implanted into the semiconductor layer 1a, 190 through the opening 402 (first opening) of the resist mask 402, so that the highly doped source region 1d, 192 and the highly doped drain region 1e, 194 are formed.

Figure 10D:
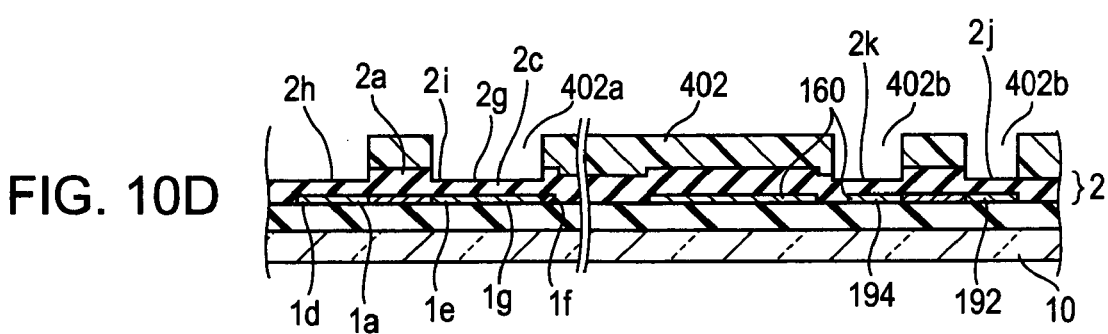

Next, as shown in FIG. 10D, the surface of the dielectric layer 2c is etched to be thin through the opening 402a of the resist mask 402, and the concave portion 2g (first concave portion) is formed in the dielectric layer 2c (dielectric layer etching process).

In addition, for the dielectric layer etching process, the gate insulating layer 2a is etched through the opening 402b of the resist mask 402, and thus the openings 2h, 2i, 2k and 2j (second concave portions) are also formed in the gate insulating layer 2a. However, the concave portions 2h, 2i, 2k and 2j are off from the gate electrode 3a, 165, so that the electric strength of the TFT 30, 190 is not lowered.

Subsequently, the resist mask 402 is removed. Further, the lower electrode forming dopant introduction process shown in FIG. 10C and the dielectric layer etching process shown in FIG. 10D may be interchanged.

Figure 11A:
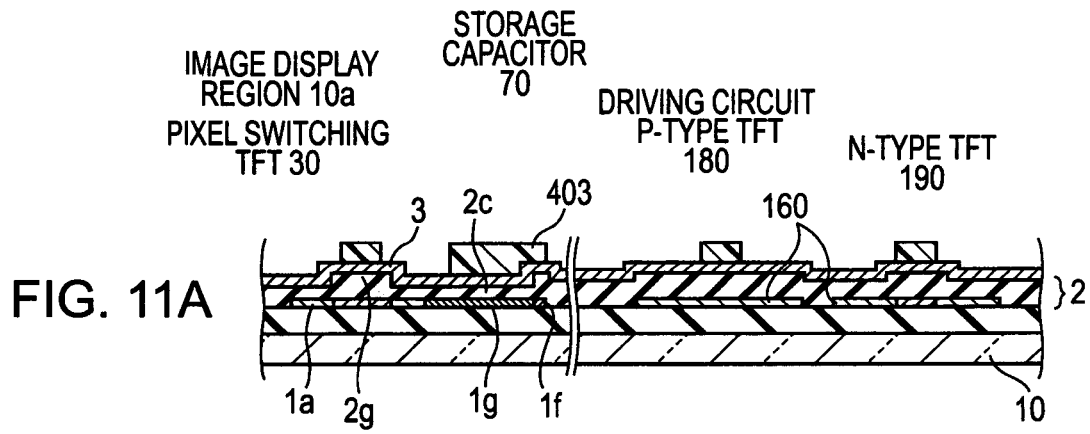
FIG. 11 is a processing cross-sectional view showing a method of manufacturing a TFT array substrate according to the second embodiment of the present invention.
Figure 11B:
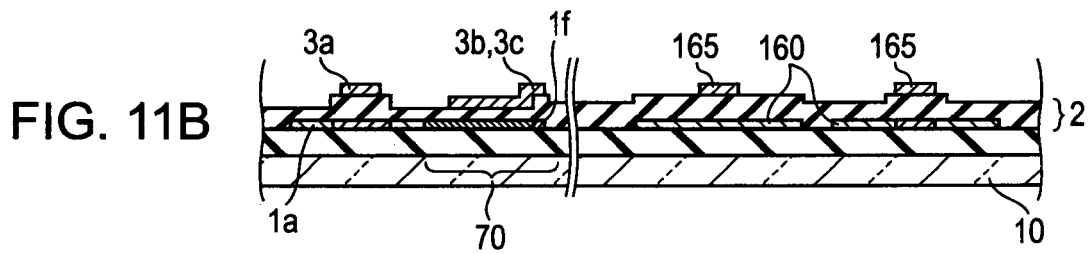
Figure 11C:
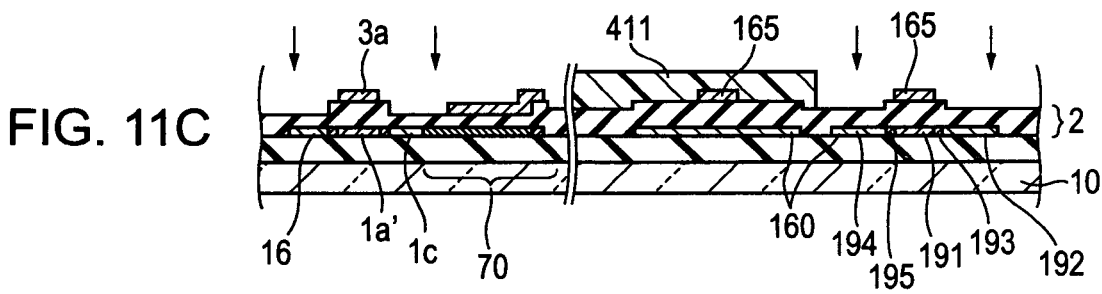
Figure 11D:
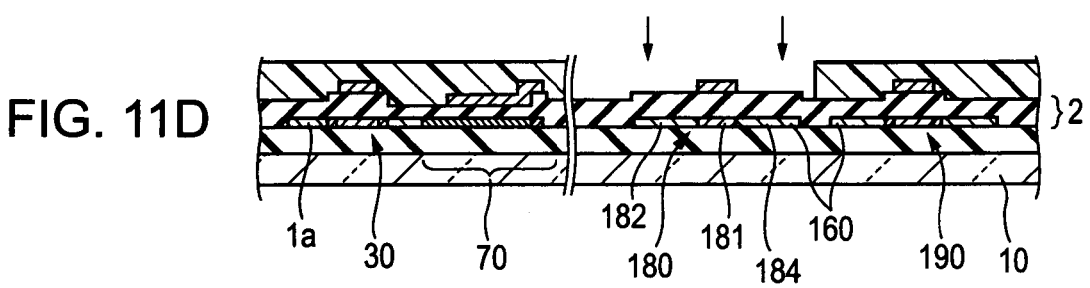

Next, as shown in FIG. 11E, a conductive layer 3 made of an Al layer, a Ta layer, a Mo layer, or an alloy layer having a primary component containing any of the above layers is formed all over the transparent substrate 10b with a thickness in a range of 300 to 800 nm through a sputtering method and so on, and then, the resist mask 403 is formed through the photolithography and the conductive layer 3 is dry etched through the resist mask 403. Consequently, as shown in FIG. 11F, the scanning line 3a, the gate electrode 165 and the capacitor line 3b (upper electrode 3c of the storage capacitor 70) are formed. As such, the storage capacitor 70 is formed.

Next, as shown in FIG. 11G, under a state where the semiconductor layer 160 for forming the P channel type TFT 180 is covered with the resist mask 411, lightly doped N type dopants (P ions) are implanted in a dosage of about $0.1 \times 10^{13}/cm^2$ to $10 \times 10^{13}/cm^2$ into the semiconductor layer 1a that constitutes the pixel switching TFT 30 and the semiconductor layer 160 that constitutes the driving circuit N channel type TFT 190, using the scanning line 3a and the gate electrode 165 as a mask, and then, the lightly doped source region 1b, 193 and the lightly doped drain region 1c, 195 are formed in a self aligned manner to the scanning line 3a and the gate electrode 165. Here, a portion where the dopant ions are not introduced since it is located directly below the scanning line 3a and the gate electrode 165 becomes a channel region 1a', 191 of the semiconductor layer 1a, 160. As a result, the TFT 30, 190 is formed.

Next, as shown in FIG. 11H, under a state where the semiconductor layer 1a, 160 for forming the N channel type TFT 30, 190 is covered with the resist mask 413, highly doped P type dopants (boron ions) are implanted in a dosage of $0.1 \times 10^{15}/cm^2$ to $10 \times 10^{15}/cm^2$ into the semiconductor layer 150 that constitutes the P channel type driving circuit TFT 180 of the driving circuit using the gate electrode 165 as a mask, to thus form the highly doped source region 182 and drain region 184. As a result, the TFT 180 is formed.

Next, as shown in FIGS. 8 and 9, after forming the interlayer insulating layer 4 made of the silicon oxide layer all over the surface of the transparent substrate 10b, the contact holes 163, 164, 168, and 169 are respectively formed in the interlayer insulating layer 4, and subsequently, through a plurality of processes such as forming the data line 6a and the drain electrode 6b such as the Al layer, the Ta layer, and the Mo layer, the TFT array substrate 10 is provided in the arrangement shown in FIGS. 4 and 5, but the well known processes can be used in the above processes so that the explanation thereof will be omitted.

As described above, according to the present embodiment, the storage capacitor 70 includes the lower electrode 1g that conductively connects the extending portion 1f (second semiconductor layer) of the semiconductor layer 1a (first semiconductor layer) of the TFT 30 side, the dielectric layer 2c coplanar with the gate insulating layer 2a of the TFT 30 side, and the upper electrode 3c coplanar with the gate electrode 3a of the TFT 30 side, so that when the lower electrode I g of the storage capacitor 70 is manufactured, it is necessary to introduce the N type dopants into the extending portion 1 f of the semiconductor layer 1a from the opening 402a of the resist mask 402 after forming the gate insulating layer 2a and the dielectric layer 2c are formed at the same time and before forming the gate electrode 3a and the upper electrode 3c. According to the present embodiment, using the resist mask 402 as it is, the lower electrode forming dopant introduction process and the dielectric layer etching process can be performed with one sheet of mask to etch the surface of the dielectric layer 2c from the opening 402a. Therefore, according to the present embodiment, the thickness of the dielectric layer 2c of the storage capacitor 70 can be smaller than the thickness of the gate insulating layer 2a of the TFT 30 without increasing the manufacturing process.

In addition, according to the present embodiment, since the opening 402b is formed in the resist mask 402 using the lower electrode forming dopant introduction process, the highly doped source region 1d, 192 and the highly doped drain region 1e, 194 of the TFT 30, 190 can be formed through the lower electrode forming dopant introduction process. Thus, one mask can be reduced. For this reason, each mask formation process and the mask removal process can also be further reduced by one, so that the productivity is enhanced.

The resist masks 401 and 402 are removed in a separate processing using the lower electrode forming dopant introduction process according to the first and second embodiments, however, when the dielectric layer 2c and the resist masks 401 and 402 are dry etched using an etchant that can etch and remove them, e.g., an etching gas (etchant) including oxygen and boron, upon performing the dielectric layer etching process after the lower electrode forming dopant introduction process, some or all of the resist masks 401 and 402 can be removed through the dielectric layer etching process, so that removing the resist masks 401 and 402 can be simplified, thus further improving the productivity.

In addition, while one layer of the insulating layer 2 that constitutes the gate insulating layer 2a and the dielectric layer 2c are illustrated in the first and second embodiments, a stacked layer such as the silicon oxide layer and the silicon nitride layer can also be used. In this case, one side out of the two insulating layers can be totally removed from some regions of the dielectric layer 2c, and the thin first region 201c may be formed.

Moreover, as a thin film semiconductor device, in addition to the substrate for the liquid crystal electro-optical device, the present may also be adapted to electro-optical devices such as an organic EL display device and an electrophoresis display device described below.

Figure 12:
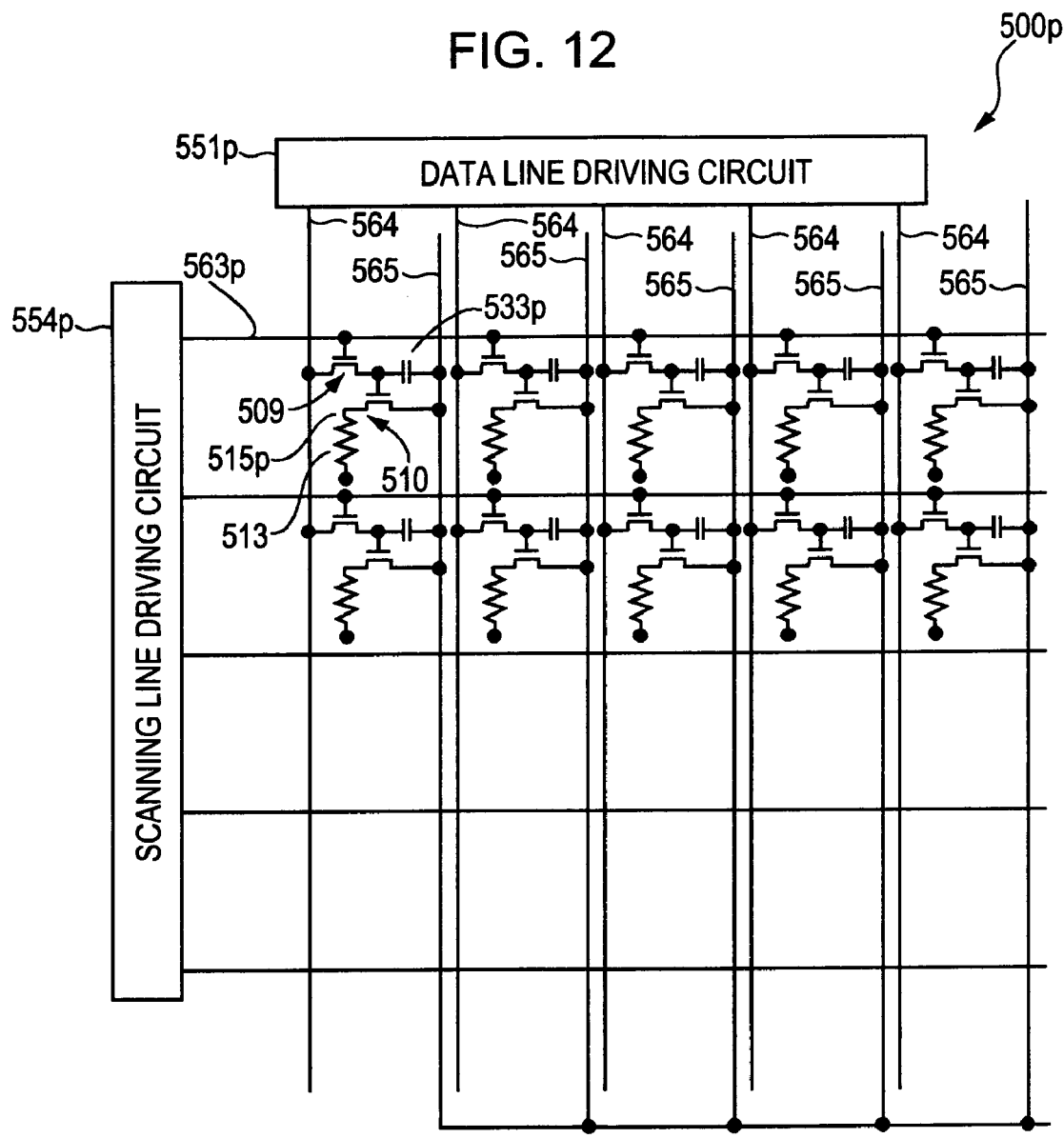
FIG. 12 is a block diagram showing an arrangement of an organic EL display device.

An organic EL display device 500p shown in FIG. 12 is a display device that drives and controls an EL device that emits light by flowing a drive current into the organic semiconductor layer using the TFT, and all of the light emitting devices used for this type of display device are self emission type, so that it does not require a backlight and is advantageously less dependent on a viewing angle. The electro-optical device 500p described herein includes a plurality of scanning lines 563p, a plurality of data lines 564 arranged to extend in an intersection direction to the extending direction of the scanning lines 563p, a plurality of common power supply lines 505 in parallel with the data lines 564, and pixels 515p corresponding to intersection points between the data lines 564 and the scanning lines 563p, and the pixels 515p are arranged in the image display region 100 in a matrix. A data line driving circuit 551p including a shift register, a level shifter, a video line, and an analog switch is arranged in the data line 564. A scanning line driving circuit 554 including a shift register, and a level shifter is arranged in the scanning line 563p. In addition, each of the pixels 515p includes a switching TFT 509 in which scanning signals are supplied to a gate electrode through the scanning line 563p, a storage capacitor 533p that retains data signals supplied from the data line 564 through the switching TFT 509, a current TFT 510 into which the image signal retained in the storage capacitor 533p is supplied to a gate electrode, and a light emitting device 513 into which a drive current is flowed from the common power supply line 505 when electrically connected to the common power supply line 505 through the TFT 510. The light emitting device 513 includes a hole injection layer, an organic semiconductor layer as the organic EL material layer, and a counter electrode made of a metal layer such as Li containing Al and Ca, stacked on the upper layer of the pixel electrode, and the counter electrode bridges over the data line 564 and is formed over the plurality of pixels 515p.

The organic EL display device 500p is also a thin film semiconductor device having the TFT and the capacitive element formed on the same substrate, so that the present invention can be adapted to the organic EL display device 500p.

The electro-optical device such as the liquid crystal device 100 according to the present invention can be used for display units of various electronic apparatus, and its example is illustrated with reference to FIGS. 13A and 13B.

Figure 13A:
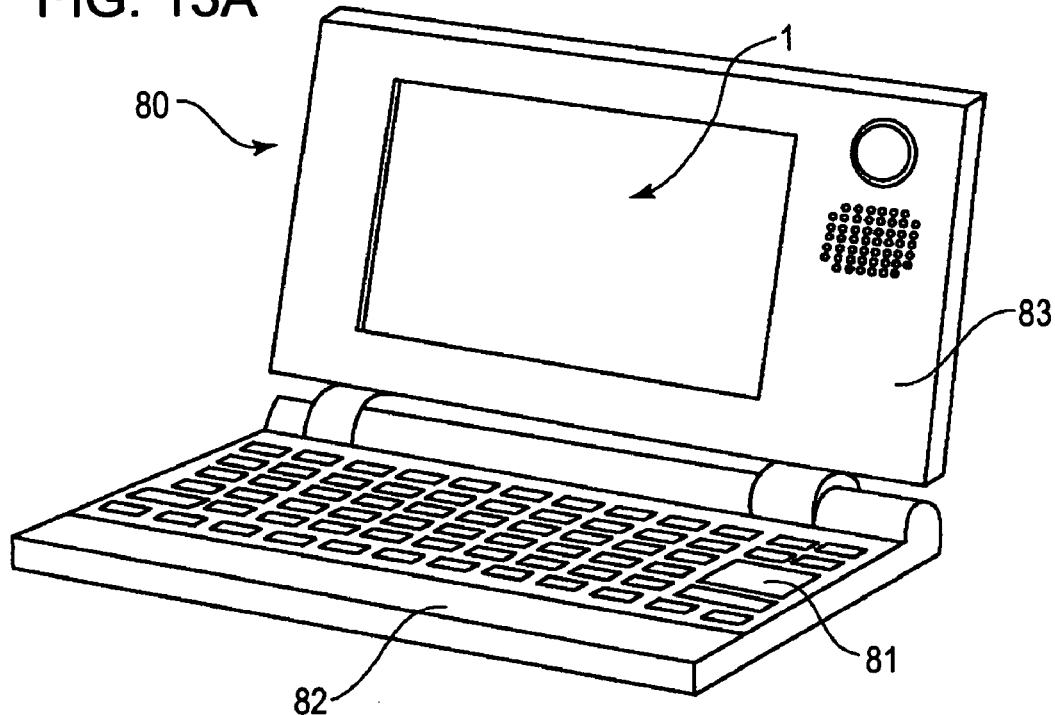
FIGS. 13A and 13B are diagrams explaining a mobile type personal computer and a mobile phone using an electro-optical device according to the present invention, respectively.

FIG. 13A is a diagram of a mobile type personal computer according to an embodiment of the electronic apparatus of the present invention. A personal computer 80 described herein includes a body unit 82 having a keyboard 81, and a liquid crystal display unit 83. The liquid crystal display unit 83 includes the above-mentioned liquid crystal device 100.

Figure 13B:
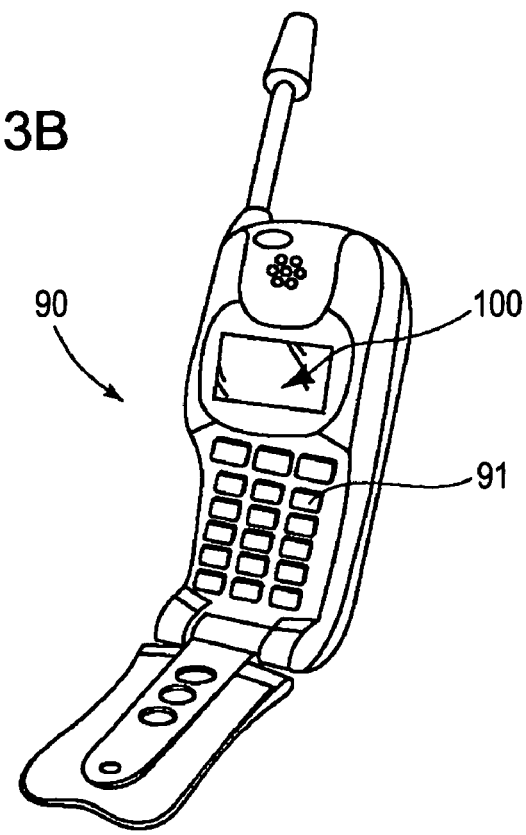

FIG. 13B is a diagram of a mobile phone according to another embodiment of the electronic apparatus of the present invention. The mobile phone 90 described herein includes a display unit having a plurality of control buttons 91 and the above-mentioned liquid crystal device 100.

What is claimed is:

1. A method of manufacturing a thin film semiconductor device, the thin film semiconductor device including a thin film transistor having a first semiconductor layer, a gate insulating layer, and a gate electrode which are laminated in this order on a substrate, and a capacitive element having a lower electrode that conductively connects a second semiconductor layer coplanar with the first semiconductor layer, a dielectric layer coplanar with the gate insulating layer, and an upper electrode coplanar with the gate electrode which are laminated in this order on the substrate, the method comprising:

after simultaneously forming the gate insulating layer and the dielectric layer, and before forming the gate electrode and the upper electrode, introducing dopants into the second semiconductor layer from a first opening of a mask formed on a surface of the substrate to form the lower electrode; and etching a surface of the dielectric layer from the first opening of the mask.

2. The method according to claim 1,
wherein a second opening is formed in the mask to form some or all of source and drain regions in the first semiconductor layer of a thin film transistor having the same conductive type as the dopants of the thin film transistor;
in the introducing of dopants to form the lower electrode, the dopants are introduced to the second semiconductor layer and the first semiconductor layer from the first and second openings; and
in the etching of the dielectric layer, the surface of the dielectric layer and a surface of the gate insulating layer are etched from the first and second openings.

3. The method according to claim 2,
wherein the source and drain regions have lightly doped source and drain regions self-aligned in the gate electrode, and highly doped source and drain regions adjacent to the lightly doped source and drain regions; and
the second opening is formed in a region where the highly doped source and drain regions are to be formed.

4. The method according to claim 1, wherein the etching of the dielectric layer is performed using an etchant that etches and removes the dielectric layer and the mask, after the introducing of the dopants to form the lower electrode.

* * * * *